(12) United States Patent
Hammond et al.

(10) Patent No.: US 10,759,660 B2
(45) Date of Patent: Sep. 1, 2020

(54) METHOD FOR PROCESSING PRODUCT WAFERS USING CARRIER SUBSTRATES

(71) Applicant: RF Micro Devices, Inc., Greensboro, NC (US)

(72) Inventors: Jonathan Hammond, Oak Ridge, NC (US); Jan Edward Vandemeer, Mesa, AZ (US); Julio Costa, Oak Ridge, NC (US)

(73) Assignee: Qorvo US, Inc., Greensboro, NC (US)

( * ) Notice: Subject to any disclaimer, the term of this patent is extended or adjusted under 35 U.S.C. 154(b) by 407 days.

(21) Appl. No.: 14/711,352

(22) Filed: May 13, 2015

(65) Prior Publication Data
US 2015/0329355 A1 Nov. 19, 2015

Related U.S. Application Data

(60) Provisional application No. 61/992,502, filed on May 13, 2014.

(51) Int. Cl.
*B81C 1/00* (2006.01)

(52) U.S. Cl.
CPC ........ *B81C 1/00269* (2013.01); *B81C 1/0015* (2013.01); *B81C 2201/0194* (2013.01);
(Continued)

(58) Field of Classification Search
CPC ........ B81C 1/00269; B81C 2201/0194; B81C 1/0015; B81C 2203/0127; B81C 2203/0118
See application file for complete search history.

(56) References Cited

U.S. PATENT DOCUMENTS

| | | | |
|---|---|---|---|
| 7,791,183 B1 * | 9/2010 | Reid, Jr. | B81B 7/007 257/678 |
| 2006/0263931 A1 * | 11/2006 | McClure | H03H 9/059 438/106 |

(Continued)

FOREIGN PATENT DOCUMENTS

EP    1 286 385 A2 *  7/2002

OTHER PUBLICATIONS

EP 1 286 385 Machine Translation of Description (EPO and Google).*

(Continued)

*Primary Examiner* — Christopher T Schatz
*Assistant Examiner* — Cynthia L Schaller
(74) *Attorney, Agent, or Firm* — Withrow & Terranova, P.L.L.C.

(57) ABSTRACT

A method for processing product wafers using carrier substrates is disclosed. The method includes a step of bonding a first carrier wafer to a first product wafer using a first temporary adhesion layer between a first carrier wafer surface and a first product wafer first surface. Another step includes bonding a second carrier wafer to a second product wafer using a second temporary adhesion layer between a second carrier wafer surface and a second product wafer surface. Another step includes bonding the first product wafer to the second product wafer using a permanent bond between a first product wafer second surface and a second product wafer first surface. In exemplary embodiments, at least one processing step is performed on the first product wafer after the first temporary carrier wafer is bonded to the first product wafer before the second product wafer is permanently bonded to the first product wafer.

16 Claims, 8 Drawing Sheets

(52) U.S. Cl.
CPC .............. *B81C 2203/0118* (2013.01); *B81C 2203/0127* (2013.01)

(56) References Cited

U.S. PATENT DOCUMENTS

| | | | | |
|---|---|---|---|---|
| 2007/0048898 A1* | 3/2007 | Carlson | ............... | B81C 1/00269 438/106 |
| 2012/0034437 A1* | 2/2012 | Puligadda | ........... | H01L 21/2007 428/212 |
| 2012/0080052 A1* | 4/2012 | Canale | .................. | B23Q 3/084 134/1.1 |

OTHER PUBLICATIONS

Ishida, et al., "Temporary Bonding/De-Bonding and Permanent Wafer Bonding Solutions for 3D Integration" (copyright 2012 IEEE) (ieeexplore.ieee.org/iel7/6520952/6523374/06523416.pdf).*

Hermanowski, James, "Thin Wafer Handling—Study of Temporary Wafer Bonding Materials and Processes," 2009 IEEE International Conference on 3D System Integration, IEEE, Sep. 2009, 5 pages, http://www.suss.com/fileadmin/user_upload/technical_publications/thin_wafer_handling_temporary_wafer_bonding.pdf.

Trichur, Ram K., "Thin Wafer Handling Technologies for Layer Transfer Processes in High-Brightness LED Manufacturing," Brewer Science, Inc., Semicon West, 2011, 21 pages, http://semiconwest.org/sites/semiconwest.org/files/Ram%20Trichur_Brewer%20Science.for%20posting.pdf.

Shorey, Aric, "Progress in Fabrication and Test of Glass Interposer Substrates," IMAPs Device Packaging Conference, Mar. 12, 2014, 20 pages.

\* cited by examiner

METHOD FOR PROCESSING PRODUCT WAFERS USING CARRIER SUBSTRATES

RELATED APPLICATIONS

This application claims the benefit of U.S. provisional patent application No. 61/992,502, filed May 13, 2014, the disclosure of which is incorporated herein by reference in its entirety.

FIELD OF THE DISCLOSURE

The disclosure relates to bonding and processing microelectronics wafers.

BACKGROUND

Some electronics manufacturing technologies require atypical substrate materials such as glass. However, electronics foundries encounter difficulty in processing glass substrates due to glass being transparent. As a result, electronic foundries typically can only process atypical substrates using costly independent lines of tools. At best, when processing glass substrates, electronic foundries must provide tools to detect glass substrates in order to direct automated tools to lift glass substrates from a wafer boat and safely pass them to process tools. Further still, the electronic foundries must at some point remove processed glass substrates from the process tools without damaging either the tool or the processed glass substrates. Such delicate processes can produce barriers for high-volume manufacturing of products that includes atypical substrates such as glass substrates. As mentioned above, one substantial barrier is an increased cost associated with developing independent lines of tools. Another substantial barrier is a limited supply chain of tools for working with wafers made of atypical materials. What is needed is a method for processing wafers made of atypical materials that does not require costly independent lines of tools.

SUMMARY

A method for processing product wafers using carrier substrates is disclosed. The method includes a step of bonding a first carrier wafer to a first product wafer using a first temporary adhesion layer between a first carrier wafer surface and a first product wafer first surface. Another step includes bonding a second carrier wafer to a second product wafer using a second temporary adhesion layer between a second carrier wafer surface and a second product wafer surface. Yet another step includes bonding the first product wafer to the second product wafer using a permanent bond between a first product wafer second surface and a second product wafer first surface.

In exemplary embodiments, at least one processing step is performed on the first product wafer after the first carrier wafer is bonded to the first product wafer before the second product wafer is permanently bonded to the first product wafer. Moreover, at least one additional processing step is conducted after the first product wafer is permanently bonded to the second product wafer, but before the first product wafer is debonded from the first carrier wafer.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description, serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element, or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element, or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Figure 1:
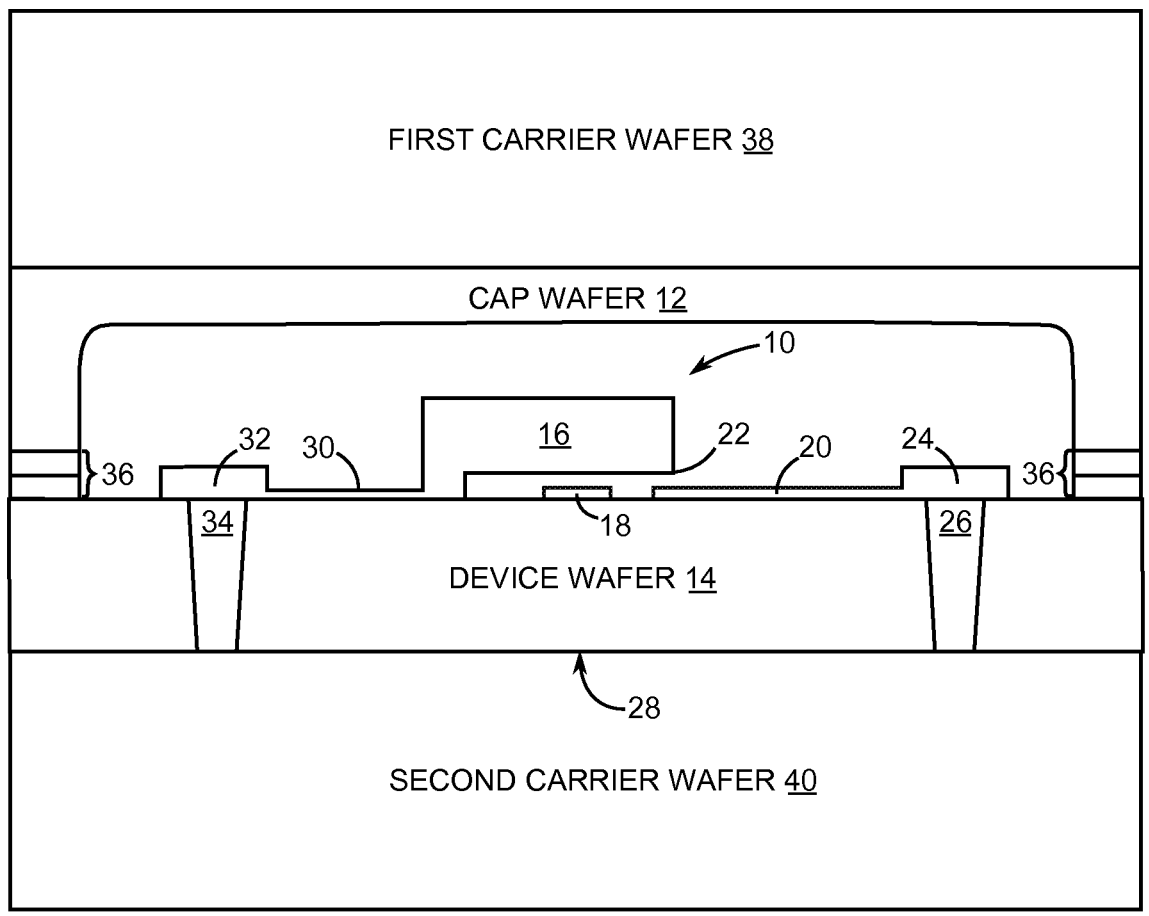
FIG. 1 depicts a related art microelectromechanical systems (MEMS) device having two carrier wafers bonded to a cap wafer and a device wafer using permanent adhesive for the purpose of carrying the MEMS device through finishing process steps.

FIG. 1 depicts a partially finished related art microelectromechanical systems (MEMS) device 10 that requires an atypical substrate material to provide a hermetic seal for the MEMS device 10. In this exemplary case, the atypical substrate material is glass that makes up a cap wafer 12. A device wafer 14 serves as a substrate onto which the MEMS device 10 is fabricated. The device wafer 14 is also made of glass in this exemplary case. However, it is to be understood that the substrate material can be typical or atypical because the method steps and structures of this disclosure are not limited to atypical substrate materials.

The MEMS device 10 has a conductive cantilever 16 that resides above an actuator plate 18 that serves as a gate that electrostatically attracts the conductive cantilever 16 towards the actuator plate 18 when the actuator plate 18 is energized with charges that are opposite in polarity to charges on the conductive cantilever 16. A first conductive plate 20 residing on the device wafer 14 is in proximity of a free end 22 of the conductive cantilever 16. The free end 22 makes contact with the first conductive plate 20 when the actuator plate 18 is energized. A drain terminal 24 is coupled between the first conductive plate 20 and a drain via 26 that passes through the device wafer 14 to a backside 28. The drain via 26 is typically further coupled to backside circuitry (not shown). A second conductive plate 30 is coupled between a source terminal 32 and the conductive cantilever 16. A source via 34 passes through the device wafer 14 to the backside 28 to couple the source terminal 32 to backside circuitry (not shown).

In operation, the actuator plate 18 is energized and the conductive cantilever 16 is pulled towards the actuator plate 18 to a point such that the free end 22 of the conductive cantilever 16 makes contact with the first conductive plate 20. As a result, a conductive path is created through the conductive cantilever 16 from the source terminal 32 to the drain terminal 24.

A free space is left around the MEMS device 10 to allow the conductive cantilever 16 to move. The dimensions of the conductive cantilever 16 are on the order of micrometers ($\mu m$) and the mass of the conductive cantilever 16 is on the order of fractions of a gram. Due to the functional requirements of the MEMS device 10, it is commonly necessary to seal the MEMS device 10 from the atmosphere to protect the MEMS device 10 from contamination, moisture, or interference from particles. For at least this reason, the cap wafer 12 and the device wafer 14 are permanently bonded together at a seal 36 that encompasses the MEMS device 10.

In order to process and permanently bond the cap wafer 12 to the device wafer 14, a first carrier wafer 38 and a second carrier wafer 40 are bonded using permanent adhesive to the cap wafer 12 and the device wafer 14, respectively. The first carrier wafer 38 and the second carrier wafer 40 serve as carrier substrates that are used to move and position the cap wafer 12 and the device wafer 14 through finishing processes. However, at the end of the finishing processes, the first carrier wafer 38 and the second carrier wafer 40 must be removed from the cap wafer 12 and the device wafer 14 in order to reduce the overall height of a finished product comprising the MEMS device 10, the cap wafer 12, and the device wafer 14. The overall height for the finished product ranges between about 100 $\mu m$ to around 300 $\mu m$. In some embodiments, the cap wafer 12 and the device wafer 14 each range in height from about 50 $\mu m$ to around 100 $\mu m$. In other embodiments, the cap wafer 12 and the device wafer 14 each range in height from about 100 $\mu m$ to around 200 $\mu m$.

Figure 2:
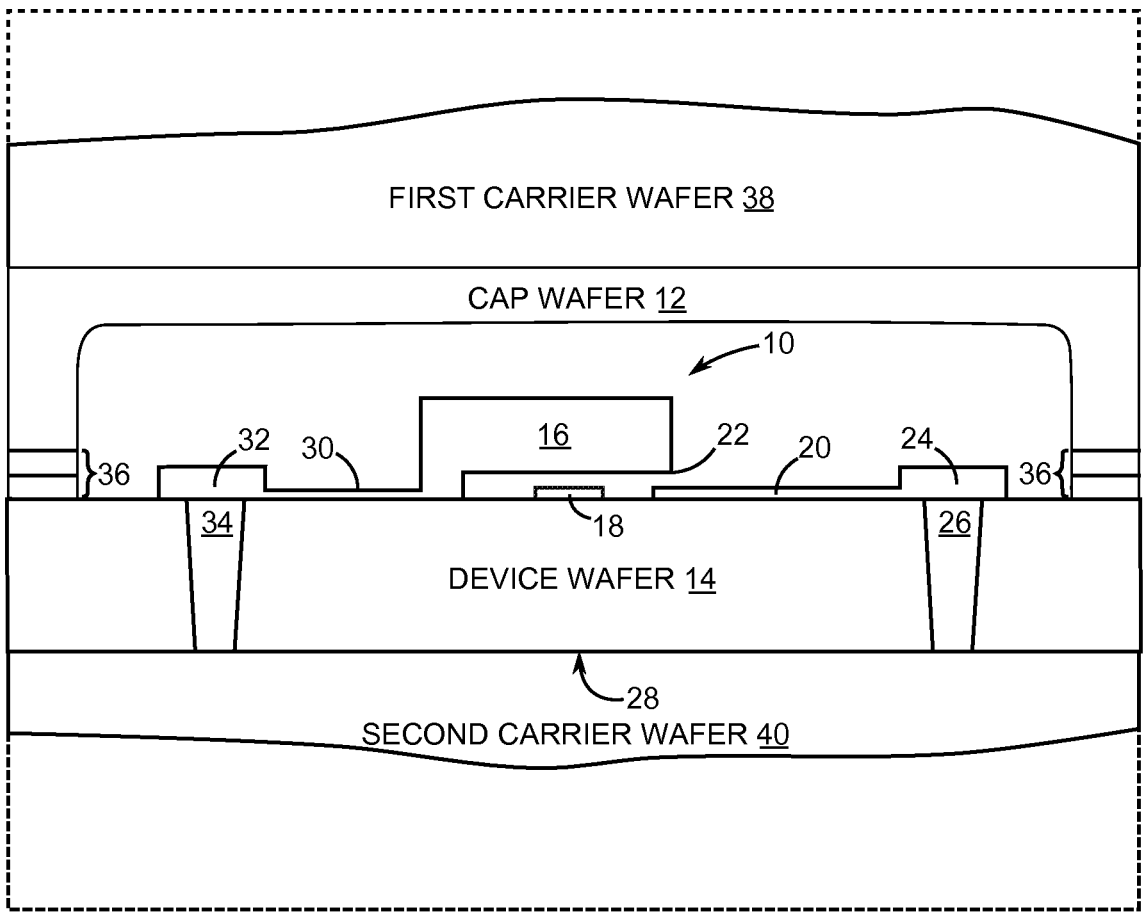
FIG. 2 depicts the related art MEMS device after a partial etching away of the two carrier wafers.
Figure 3:
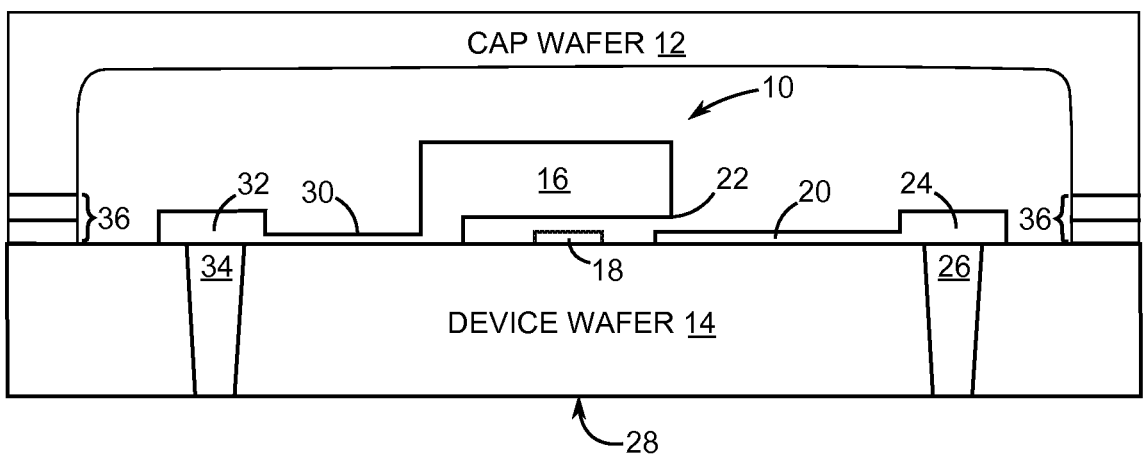
FIG. 3 depicts the related art MEMS device after completion of processing and after complete removal of the two carrier wafers.

In this regard, FIG. 2 depicts the related art MEMS device 10 after a partial etching away of the first carrier wafer 38 and the second carrier wafer 40 during an etching process. The first carrier wafer 38 and the second carrier wafer 40 are typically made of silicon (Si), so standard etchants for Si are usable to dissolve the first carrier wafer 38 and the second carrier wafer 40. Etching away the first carrier wafer 38 and the second carrier wafer 40 ultimately frees the cap wafer 12, the device wafer 14, and the MEMS device 10, as shown in FIG. 3. However, the etching process is unacceptably time consuming and too costly for high-volume manufacturing. Other methods of removing the first carrier wafer 38 and the second carrier wafer 40 such as grinding have also been evaluated, but such methods have not been able to solve the problem of unacceptable time consumption.

Figure 4:
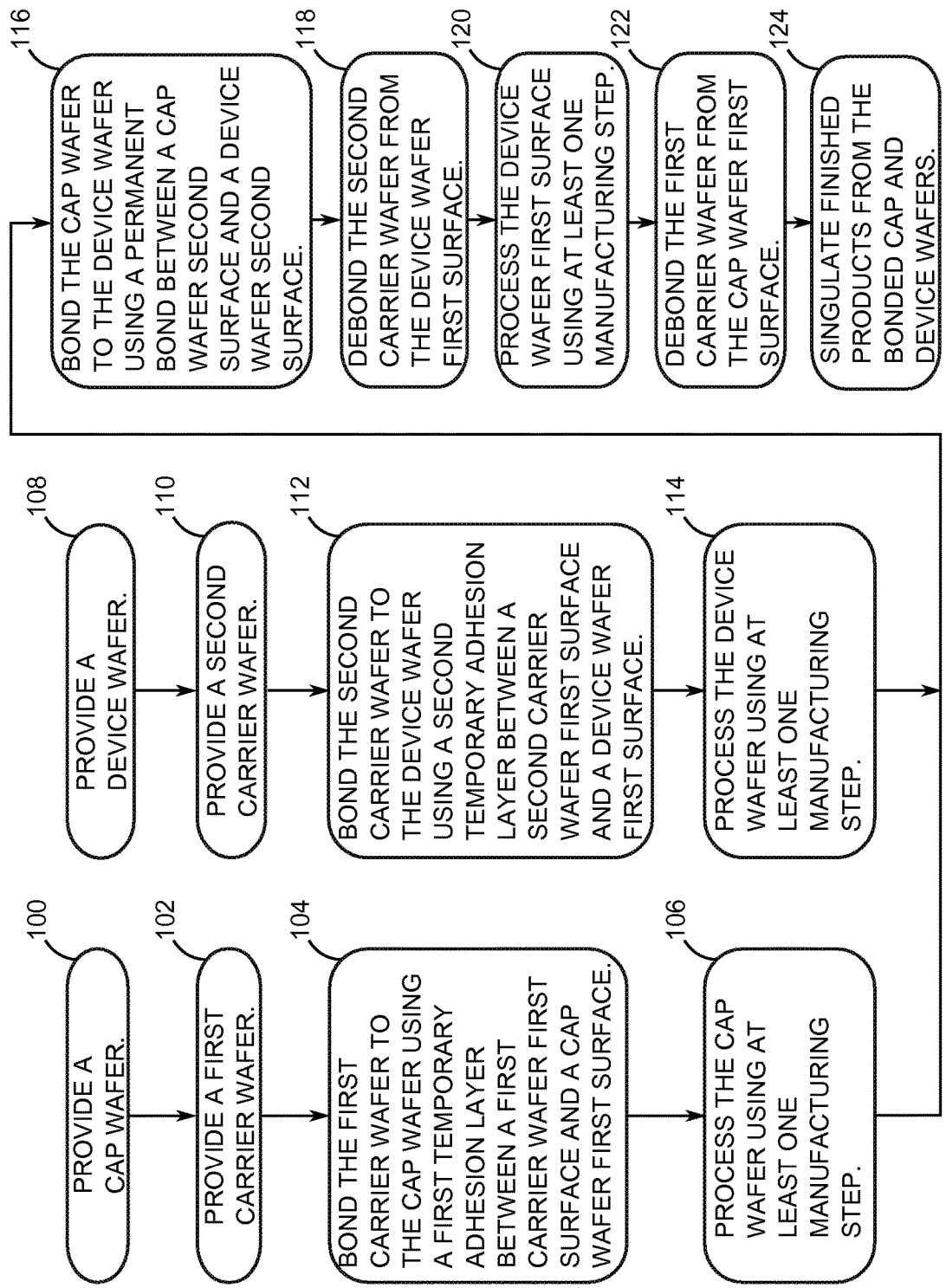
FIG. 4 is a process flow diagram for an exemplary embodiment of the present disclosure that produces MEMS devices having atypical substrates.
Figure 5:
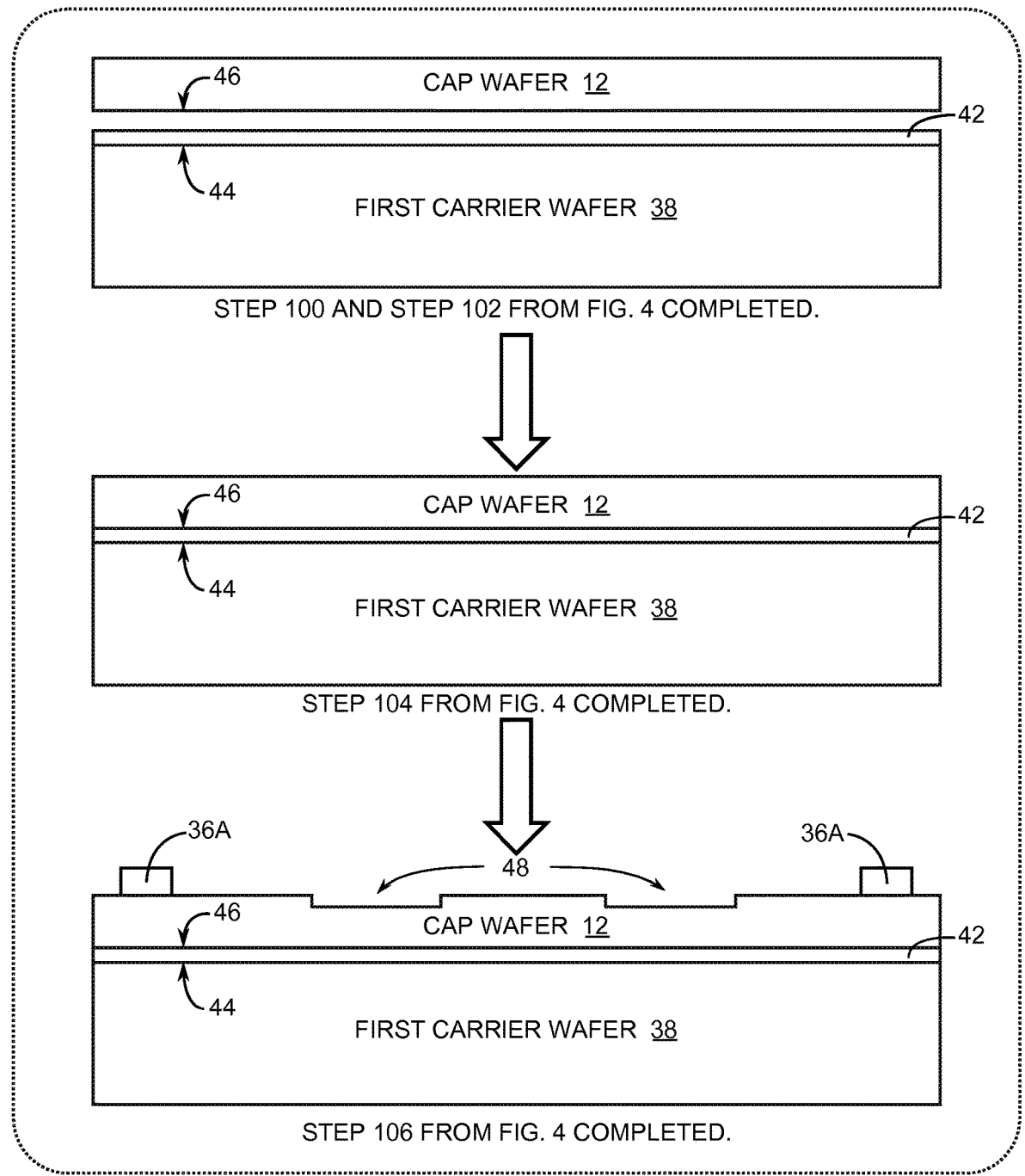
FIG. 5 depicts structural diagrams and a sub-process flow for temporarily bonding a first carrier wafer to a cap wafer that is exemplary of structure and processing of a first product wafer in accordance with the present disclosure.

FIGS. 4 to 9 disclose a process for reducing the time and cost to remove the first carrier wafer 38 and the second carrier wafer 40 from the cap wafer 12 and the device wafer 14, respectively. In particular, FIG. 4 is a process flow diagram for an exemplary embodiment of the present disclosure that produces MEMS devices 10 having atypical substrates. FIG. 5 depicts structural diagrams and a sub-process flow comprising the process flow of FIG. 4. The sub-processing flow provides temporarily bonding between the first carrier wafer 38 and the cap wafer 12 that is exemplary of structure and processing of a first product wafer in accordance with the present disclosure.

As shown in FIG. 4, the process flow begins with providing the first product wafer, that in this exemplary case is the cap wafer 12 (step 100). The first carrier wafer 38 is also provided (step 102). Next, the first carrier wafer 38 is bonded to the cap wafer 12 using a first temporary adhesion layer 42 (FIG. 5) that resides between a first carrier wafer first surface 44 and a cap wafer first surface 46 (step 104). Once the first carrier wafer 38 is bonded to the cap wafer 12, processing of the cap wafer 12 can begin (step 106). In the exemplary embodiment on FIG. 5, a first half seal 36A is added ultimately to mate with a second half seal 36B (FIG. 6) to form seal 36 (FIGS. 1, 2, 3, 7, 8, and 9). In this exemplary process, cavities 48 are formed to give the conductive cantilever 16 space to move.

Figure 6:
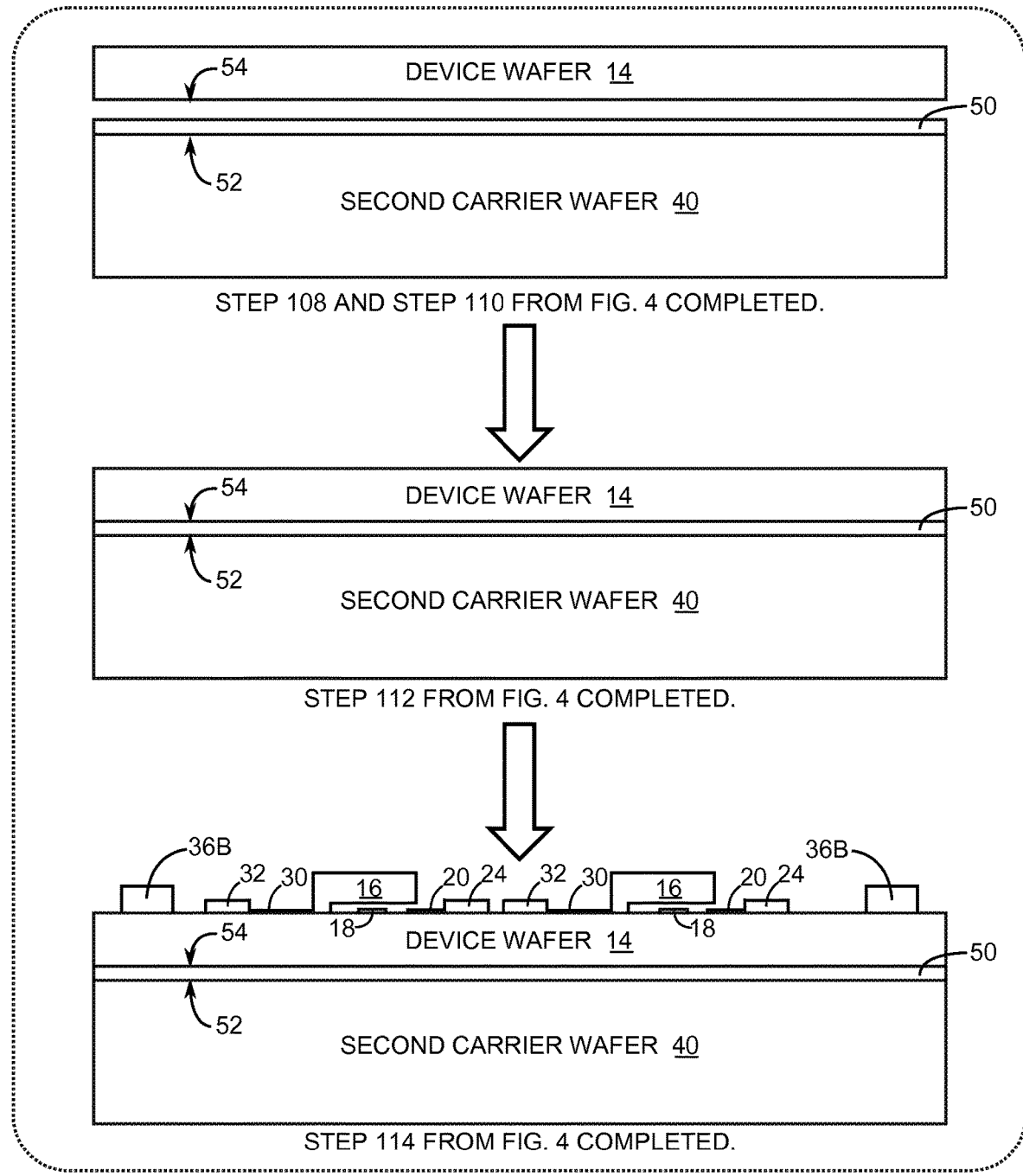
FIG. 6 depicts structural diagrams and a sub-process flow for temporarily bonding a second carrier wafer to a device wafer that is exemplary of structure and processing of a second product wafer in accordance with the present disclosure.

Returning to FIG. 4 and keeping FIG. 6 available, the process continues by providing the device wafer 14 (step 108). The second carrier wafer 40 is also provided (step 110). Next, the second carrier wafer 40 is bonded to the device wafer 14 using a second temporary adhesion layer 50 (FIG. 6; step 112). The second temporary adhesion layer 50 resides between a second carrier wafer first surface 52 (FIG. 6) and a device wafer first surface 54 (FIG. 6). Exemplary materials for the first temporary adhesion layer 42 and the second temporary adhesion layer 50 include, but are not limited to, polyimide film, polyimide tape, and polyimide adhesive, and combinations thereof.

Once the second carrier wafer 40 is bonded to the device wafer 14, processing of the device wafer 14 can begin (step 114). In the exemplary embodiment of FIG. 6, a second half seal 36B is added ultimately to mate with a first half seal 36A (FIG. 5) to form the seal 36 (FIGS. 1, 2, 3, 7, 8, and 9). In this exemplary process, MEMS devices 10 are fabricated onto the device wafer 14.

Figure 7:
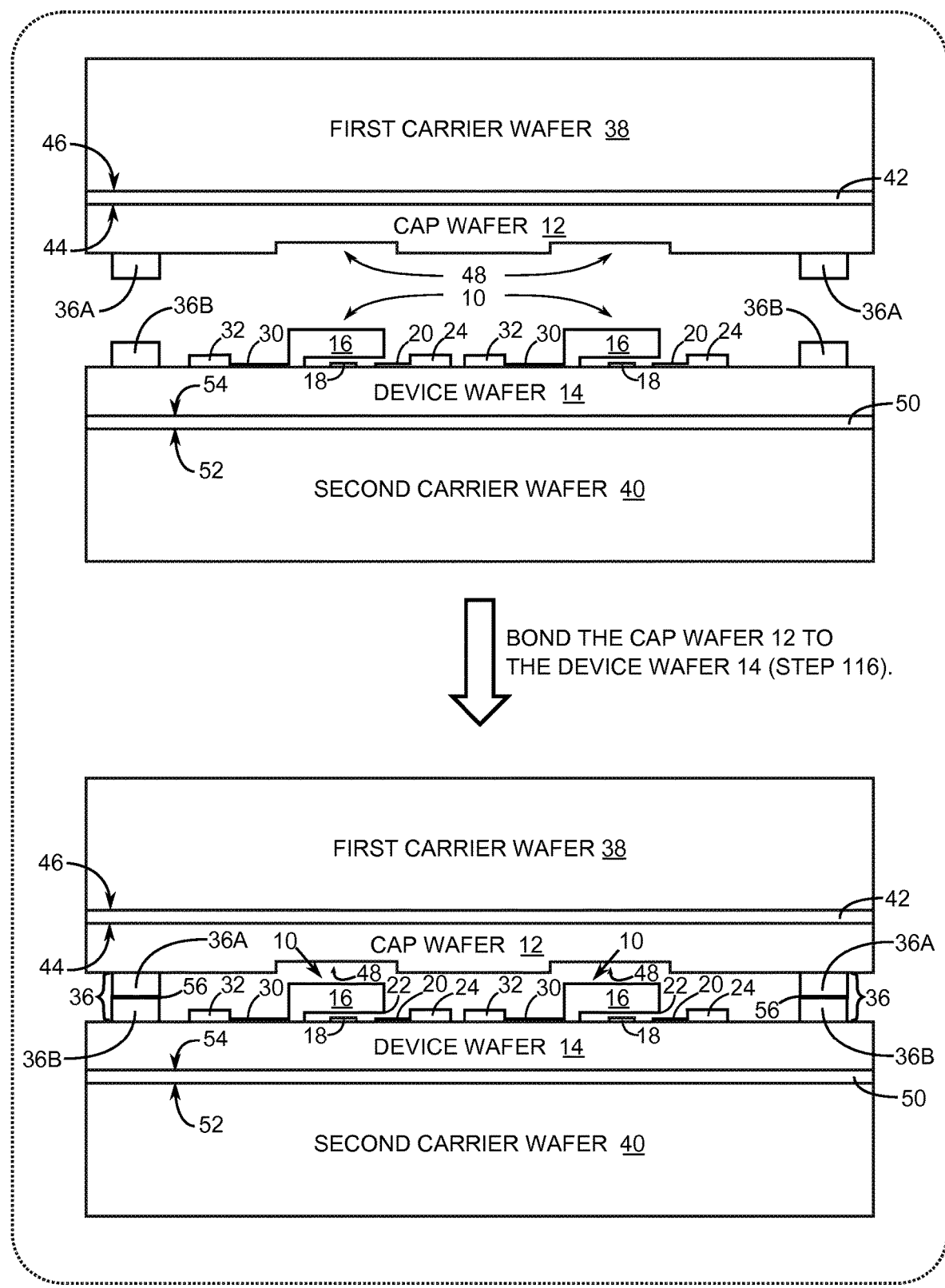
FIG. 7 depicts structural diagrams and a sub-process flow for permanently bonding the cap wafer to the device wafer that is exemplary of bonding the first product wafer to the second product wafer in accordance with the present disclosure.

After the processing of step 114 is completed, the cap wafer 12 and the device wafer 14 are bonded together with a permanent bond 56 (FIG. 7; Step 116). The permanent bond 56 is typically created by heat and pressure. While the seal 36 is shown in this exemplary embodiment as comprising the first half seal 36A and the second half seal 36B, it is to be understood that the permanent bond 56 can be created between different surfaces. For example, instead of using the first half seal 36A and the second half seal 36B, the permanent bond 56 could be achieved between outer surfaces of the seal 36 and surfaces of the cap wafer 12 and the device wafer 14. Moreover, other permanent bonding methods will occur to those skilled in the art, and those permanent bonding methods do not limit the scope of the present disclosure.

Figure 8:
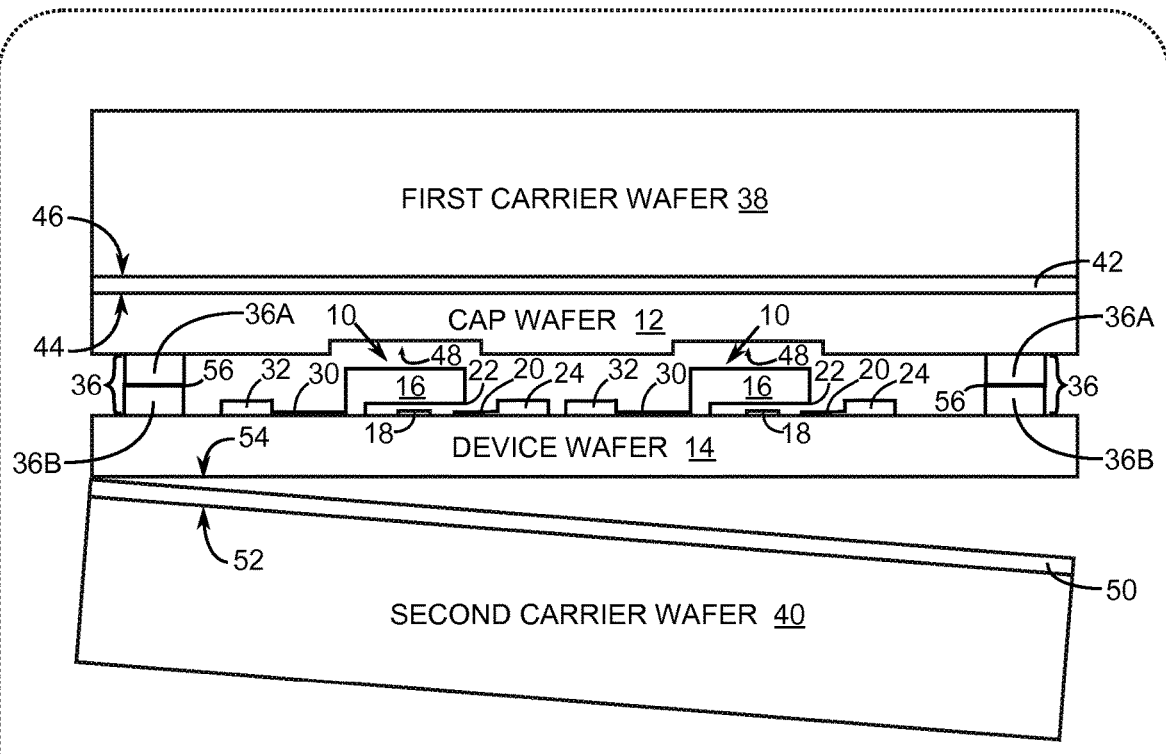
FIG. 8 depicts a structural diagram and a sub-process for debonding the second carrier wafer from the device wafer that is exemplary of structure and processing of debonding the second carrier wafer from the second product wafer in accordance with the present disclosure.
Figure 8:
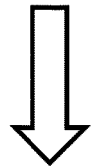
Figure 8:
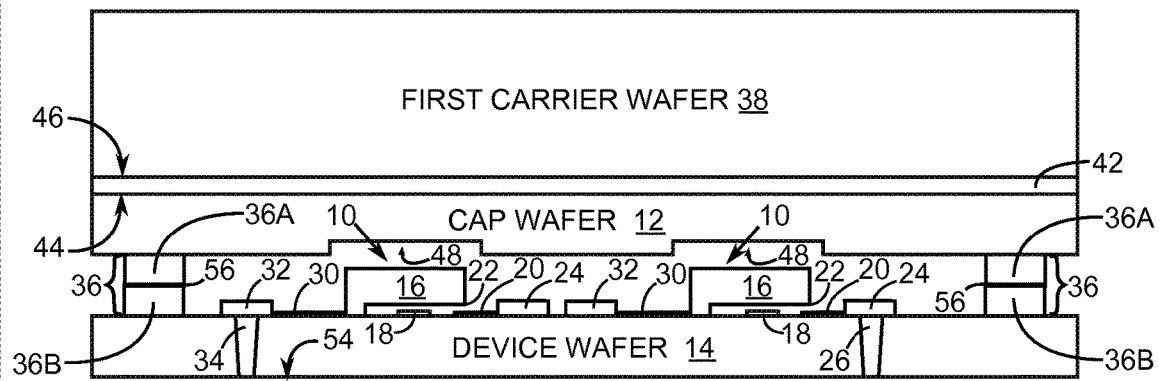

The process continues with debonding the second carrier wafer 40 from the device wafer 14 (step 118). FIG. 8 shows that the second carrier wafer 40 can be debonded from the device wafer 14 using a prying motion. In at least one embodiment, the first carrier wafer 38 and the second carrier wafer 40 are adapted to be pried from the cap wafer 12 and the device wafer 14 using an automated tool (not shown) such as a robotic line tool. The second temporary adhesion layer 50 is removed completely from the device wafer first surface 54 during debonding.

Once the second carrier wafer is debonded from the device wafer first surface 54, processing of the device wafer first surface 54 can begin (step 120). In this exemplary case, the drain via 26 and the source via 34 are fabricated (see FIG. 8). Additional processing such as back-side metals (not shown) can also be added at this time.

Figure 9:
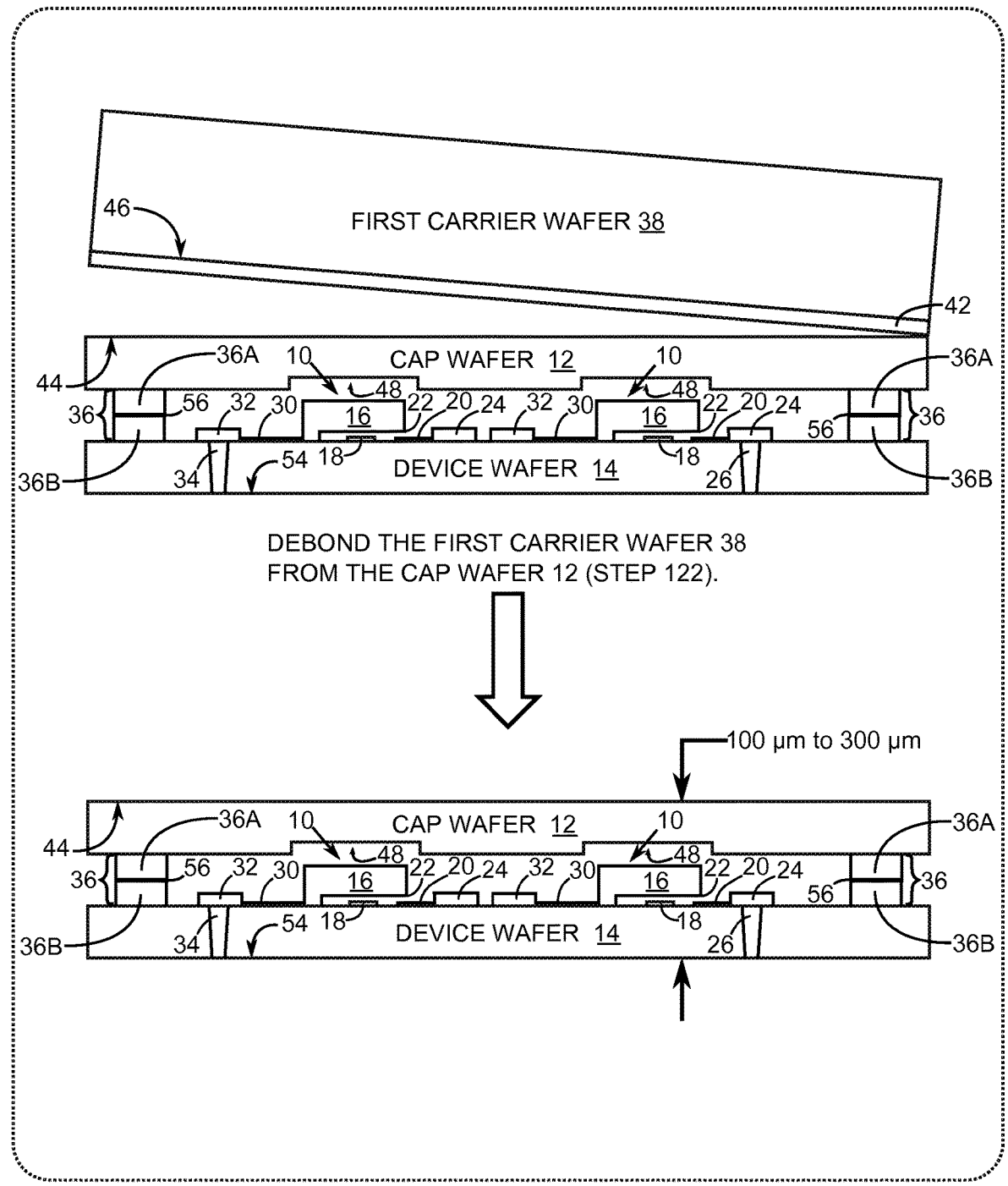
FIG. 9 depicts structural diagrams and a sub-process flow for debonding a first carrier wafer from the cap wafer that is exemplary of structure and processing of debonding the first carrier wafer from the first product wafer in accordance with the present disclosure.

Moving back to FIG. 4 and forward to FIG. 9, the first carrier wafer 38 is debonded from the cap wafer first surface 46 after processing the device wafer first surface 54 is completed (step 122). As with the debonding of the second carrier wafer 40, an automated tool (not shown) such as a robotic line tool can be used to provide the prying motion to debond the first carrier wafer 38 from the cap wafer 12. The first temporary adhesion layer 42 is removed completely from the cap wafer first surface 46 during debonding. Once the cap wafer 12, the device wafer 14, and the MEMS device(s) 10 as finished products are freed from the first carrier wafer 38 and the second carrier wafer 40, finished products are then singulated (step 124).

While a prying motion is depicted in the exemplary embodiments of FIG. 8 and FIG. 9, it is to be understood that other debonding schemes such as applying heat and sliding the first carrier wafer 38 and the second carrier 40 away from the cap wafer first surface 46 and the device wafer first surface 54, respectively, can be implemented within a manufacturing line. Yet, other debonding methods include but are not limited to techniques such as using solvents to chemically dissolve the first temporary adhesion layer 42 and the second temporary adhesion layer 50 can also be used. It is also to be understood that while the exemplary embodiments depicted in this disclosure are MEMS devices, the methods of the present disclosure are equally applicable to other products in the electronics industry such as resonators. In fact, the methods of the present disclosure are applicable to the manufacture of any product in which a first carrier wafer and a second carrier wafer are used to carry a permanently bonded first product wafer and second product wafer through one or more manufacturing processes.

Those skilled in the art will recognize improvements and modifications to the embodiments of the present disclosure. All such improvements and modifications are considered within the scope of the concepts disclosed herein and the claims that follow.

What is claimed is:

1. A method for processing product wafers using carrier substrates comprising:
   providing a first product wafer;
   providing a first carrier wafer;
   bonding the first carrier wafer to the first product wafer using a first temporary adhesion layer between a first carrier wafer first surface and a first product wafer first surface;
   forming at least one cavity within the first product wafer to provide space for a conductive cantilever of a microelectromechanical systems device to move;
   adding a first half seal to the first product wafer;
   providing a second product wafer;
   providing a second carrier wafer;
   adding a second half seal to the second product wafer;
   bonding the second carrier wafer to the second product wafer using a second temporary adhesion layer between a second carrier wafer first surface and a second product wafer first surface;
   bonding the first product wafer to the second product wafer using a permanent bond between the first half seal and the second half seal, while the first product wafer is temporarily bonded to the first carrier wafer and the second product wafer is temporarily bonded to the second carrier wafer;
   debonding the second carrier wafer from the second product wafer by a prying motion provided by an automated tool and removing the second temporary adhesive layer completely from the second product wafer first surface, thereby completely exposing the second product wafer first surface;
   processing the second product wafer first surface by adding back-side metal;
   debonding the first carrier wafer from the first product wafer by a prying motion provided by the automated tool and removing the first temporary adhesive layer completely from the first product wafer first surface, thereby completely exposing the first product wafer first surface; and
   singulating products from the first product wafer and the second product wafer after the first product wafer and the second product wafer are permanently bonded together and after the first carrier wafer is debonded from the first product wafer and the second carrier wafer is debonded from the second product wafer.

2. The method of claim 1 for processing product wafers using carrier substrates further comprising processing the first product wafer using at least one processing step after bonding the first carrier wafer to the first product wafer.

3. The method of claim 1 for processing product wafers using carrier substrates further comprising processing the second product wafer using at least one processing step after bonding the second carrier wafer to the second product wafer.

4. The method of claim 1 for processing product wafers wherein the first temporary adhesion layer is polyimide based.

5. The method of claim 1 for processing product wafers wherein the second temporary adhesion layer is polyimide based.

6. The method of claim 1 for processing product wafers wherein the first product wafer is made of glass.

7. The method of claim 1 for processing product wafers wherein the second product wafer is made of glass.

8. The method of claim 1 for processing product wafers wherein the first carrier wafer is made of silicon (Si).

9. The method of claim 1 for processing product wafers wherein the second carrier wafer is made of Si.

10. The method of claim 1 for processing product wafers wherein a finished product comprising the first product wafer and the second product wafer ranges in height from between about 100 μm to around 300 μm.

11. The method of claim 1 for processing product wafers wherein the first product wafer and the second product wafer each range in height from about 50 μm to around 100 μm.

12. The method of claim 1 for processing product wafers wherein the first product wafer and the second product wafer each range in height from about 100 μm to around 200 μm.

13. The method of claim 1 for processing product wafers wherein the first product wafer is a cap wafer.

14. The method of claim 1 for processing product wafers wherein the second product wafer is a device wafer.

15. The method of claim 13 for processing product wafers wherein the second product wafer includes at least one microelectromechanical systems (MEMS) device fabricated thereon.

16. The method of claim 1 for processing product wafers wherein the first carrier wafer is bonded to the first product wafer using the first temporary adhesion layer, the second carrier wafer is bonded to the second product wafer using the second temporary adhesion layer, and the first product wafer is bonded to the second product wafer using a permanent bond for at least one process step.

* * * * *